US008593037B1

(12) United States Patent
Kubena et al.

(10) Patent No.: US 8,593,037 B1
(45) Date of Patent: Nov. 26, 2013

(54) RESONATOR WITH A FLUID CAVITY THEREIN

(75) Inventors: Randall L. Kubena, Oak Park, CA (US); Tsung-Yuan Hsu, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 35 days.

(21) Appl. No.: 13/434,144

(22) Filed: Mar. 29, 2012

Related U.S. Application Data

(62) Division of application No. 12/575,634, filed on Oct. 8, 2009, now Pat. No. 8,176,607.

(51) Int. Cl.

| | |
|---|---|
| ***H01L 41/053*** | (2006.01) |
| ***H01L 41/047*** | (2006.01) |
| ***H01L 41/107*** | (2006.01) |
| ***H01L 41/113*** | (2006.01) |
| ***G01P 3/26*** | (2006.01) |
| ***G01L 7/00*** | (2006.01) |

(52) U.S. Cl.
USPC ........... 310/349; 310/328; 310/360; 310/366; 73/521; 73/571; 73/584; 73/662; 73/715

(58) Field of Classification Search
USPC ......... 310/324, 328, 348, 349, 360, 365, 366; 73/507, 514.34, 521, 571, 579, 584, 73/589, 645–648, 662, 702, 703, 715, 73/863.71; 324/633, 636
See application file for complete search history.

(56) References Cited

U.S. PATENT DOCUMENTS

| | | | | |
|---|---|---|---|---|
| 392,650 | A | 11/1888 | Watrous | |
| 2,487,165 | A | 11/1949 | Miller | |
| 3,390,287 | A | 6/1968 | Sonderegger | |
| 3,766,616 | A | 10/1973 | Staudte | 29/25.35 |
| 4,364,016 | A | 12/1982 | Tanski | 333/193 |
| 4,426,769 | A | 1/1984 | Grabbe | 29/588 |
| 4,442,574 | A | 4/1984 | Wanuga et al. | 29/25.35 |
| 4,618,262 | A | 10/1986 | Maydan et al. | 356/504 |
| 4,870,313 | A | 9/1989 | Hirama et al. | 310/320 |
| 4,898,031 | A | 2/1990 | Oikawa et al. | 73/505 |

(Continued)

FOREIGN PATENT DOCUMENTS

| | | |
|---|---|---|
| DE | 44 42 033 | 5/1996 |
| DE | 19719601 | 11/1998 |

(Continued)

OTHER PUBLICATIONS

U.S. Appl. No. 10/426,931, filed Apr. 30, 2003, Kubena.

(Continued)

*Primary Examiner* — Thomas Dougherty
(74) *Attorney, Agent, or Firm* — Ladas & Parry

(57) ABSTRACT

A quartz resonator flow cell has a piezoelectric quartz wafer with an electrode, pads, and interconnects disposed on a first side thereof. The piezoelectric quartz wafer has a second electrode disposed on a second side thereof, the second electrode opposing the first electrode. A substrate is provided having fluid ports therein and the piezoelectric quartz wafer is mounted to the substrate such that the second side thereof faces the substrate with a cavity being formed between the substrate and the wafer. The fluid ports in the substrate are aligned with the electrode on the second side of the piezoelectric quartz wafer which is in contact with the cavity.

4 Claims, 3 Drawing Sheets

(56) References Cited

U.S. PATENT DOCUMENTS 4,944,836 A 7/1990 Beyer et al. ........ 156/645
5,203,208 A 4/1993 Bernstein ........ 73/505
5,226,321 A 7/1993 Varnham et al. ........ 73/505
5,260,596 A 11/1993 Dunn et al. ........ 257/414
5,421,312 A 6/1995 Dawson ........ 123/620
5,480,747 A 1/1996 Vasudev ........ 430/5
5,530,408 A 6/1996 Vig et al.
5,552,016 A 9/1996 Ghanayem ........ 156/345.25
5,578,976 A 11/1996 Yao ........ 333/262
5,589,724 A 12/1996 Satoh et al. ........ 310/348
5,604,312 A 2/1997 Lutz ........ 73/504.14
5,605,490 A 2/1997 Laffey et al. ........ 451/36
5,644,139 A 7/1997 Allen
5,646,346 A 7/1997 Okada ........ 73/504.4
5,648,849 A 7/1997 Canteloup et al. ........ 356/503
5,658,418 A 8/1997 Coronel et al. ........ 156/345.25
5,665,915 A 9/1997 Kobayashi et al. ........ 73/514.32
5,666,706 A 9/1997 Tomita et al. ........ 29/25.35
5,668,057 A 9/1997 Eda et al. ........ 438/113
5,728,936 A 3/1998 Lutz ........ 73/504.15
5,783,749 A 7/1998 Lee et al. ........ 73/504.12
5,894,090 A 4/1999 Tang et al. ........ 73/504.02
5,905,202 A 5/1999 Kubena et al. ........ 73/504.15
5,920,012 A 7/1999 Pinson ........ 73/504.13
5,928,532 A 7/1999 Koshimizu et al. ........ 219/121.42
5,942,445 A 8/1999 Kato et al. ........ 438/691
5,959,206 A 9/1999 Ryrko
5,981,392 A 11/1999 Oisha ........ 438/691
5,987,985 A 11/1999 Okada ........ 73/504.04
6,009,751 A 1/2000 Ljung ........ 73/504.02
6,044,705 A 4/2000 Neukermans et al. ........ 73/504.02
6,049,702 A 4/2000 Tham et al.
6,081,334 A 6/2000 Grimbergen et al. ........ 356/499
6,094,985 A 8/2000 Kapels et al. ........ 73/504
6,114,801 A 9/2000 Tanaka
6,145,380 A 11/2000 MacGugan et al. ........ 73/493
6,151,964 A 11/2000 Nakajima ........ 73/488
6,155,115 A 12/2000 Ljung ........ 73/504.12
6,164,134 A 12/2000 Cargille ........ 73/504.02
6,182,352 B1 2/2001 Deschenes et al. ........ 29/602.1
6,196,059 B1 3/2001 Kosslinger ........ 73/61.49
6,204,737 B1 3/2001 Ella
6,207,008 B1 3/2001 Kijima ........ 156/345.13
6,236,145 B1 5/2001 Biernacki
6,250,157 B1 6/2001 Touge ........ 73/504.12
6,263,552 B1 7/2001 Takeuchi et al. ........ 29/25.35
6,282,958 B1 9/2001 Fell et al. ........ 73/504.13
6,289,733 B1 9/2001 Challoner et al. ........ 73/504.12
6,297,064 B1 10/2001 Koshimizu ........ 438/9
6,349,597 B1 2/2002 Folkmer et al. ........ 73/504.08
6,367,326 B1 4/2002 Okada ........ 73/504.13
6,367,786 B1 4/2002 Gutierrez et al. ........ 267/136
6,413,682 B1 7/2002 Shibano et al.
6,417,925 B1 7/2002 Naya ........ 356/445
6,424,418 B2 7/2002 Kawabata et al. ........ 356/445
6,426,296 B1 7/2002 Okojie
6,432,824 B2 8/2002 Yanagisawa
6,481,284 B2 11/2002 Geen et al. ........ 73/504.02
6,481,285 B1 11/2002 Shkel et al. ........ 73/504.13
6,492,195 B2 12/2002 Nakanishi ........ 438/106
6,513,380 B2 2/2003 Reeds et al. ........ 73/504.04
6,514,767 B1 2/2003 Natan
6,515,278 B2 2/2003 Wine et al. ........ 250/234
6,571,629 B1 6/2003 Kipp
6,584,845 B1 7/2003 Gutierrez et al. ........ 73/488
6,614,529 B1 9/2003 Tang
6,621,158 B2 9/2003 Martin et al. ........ 257/704
6,627,067 B1 9/2003 Branton et al.
6,628,177 B2 9/2003 Clark et al. ........ 333/196
6,629,460 B2 10/2003 Challoner ........ 73/504.02
6,651,027 B2 11/2003 McCall
6,710,681 B2 3/2004 Figueredo et al.
6,715,352 B2 4/2004 Tracy ........ 73/504.02
6,750,728 B2 6/2004 Takahashi
6,756,304 B1 6/2004 Robert
6,768,396 B2 7/2004 Klee et al.
6,796,179 B2 9/2004 Bae et al. ........ 73/504.12
6,806,557 B2 10/2004 Ding ........ 257/659
6,815,228 B2 11/2004 Usui et al.
6,856,217 B1 2/2005 Clark et al. ........ 333/186
6,862,398 B2 3/2005 Elkind et al.
6,883,374 B2 4/2005 Fell et al. ........ 73/504.13
6,915,215 B2 7/2005 Closkey
6,933,164 B2 8/2005 Kubena
6,943,484 B2 9/2005 Clark et al.
6,985,051 B2 1/2006 Nguyen et al. ........ 333/186
7,057,331 B2 6/2006 Shimodaira et al.
7,118,657 B2 10/2006 Golovchenko et al.
7,152,290 B2 12/2006 Junhua et al.
7,168,318 B2 1/2007 Challoner et al. ........ 73/504.13
7,224,245 B2 5/2007 Song et al.
7,232,700 B1 6/2007 Kubena
7,237,315 B2 7/2007 Kubena et al. ........ 29/594
7,317,354 B2 1/2008 Lee
7,446,628 B2 11/2008 Morris, III
7,459,099 B2 12/2008 Kubena et al. ........ 216/57
7,459,992 B2 12/2008 Matsuda et al.
7,479,846 B2 1/2009 Inoue et al.
7,490,390 B2 2/2009 Kawakubo et al.
7,543,496 B2 6/2009 Ayazi
7,551,054 B2 6/2009 Mizuno et al.
7,555,824 B2 7/2009 Chang ........ 29/594
7,557,493 B2 7/2009 Fujimoto
7,559,130 B2 7/2009 Kubena et al. ........ 29/594
7,564,177 B2 7/2009 Yoshimatsu
7,579,748 B2 8/2009 Kuroda
7,579,926 B2 8/2009 Jhung
7,581,443 B2 9/2009 Kubena
7,663,196 B2 2/2010 Liu et al.
7,671,427 B2 3/2010 Kim et al.
7,675,224 B2 3/2010 Tanaya
7,750,535 B2 7/2010 Kubena
7,757,393 B2 7/2010 Ayazi et al.
7,791,432 B2 9/2010 Piazza et al.
7,802,356 B1 9/2010 Chang
7,830,074 B2 11/2010 Kubena
7,872,548 B2 1/2011 Nishihara et al.
7,884,930 B2 2/2011 Kirby
7,895,892 B2 3/2011 Aigner
7,994,877 B1 8/2011 Kubena
8,138,016 B2 3/2012 Chang
8,151,640 B1 4/2012 Kubena
8,176,607 B1 5/2012 Kubena
2002/0066317 A1 6/2002 Lin ........ 73/170.33
2002/0072246 A1 6/2002 Goo et al.
2002/0074947 A1 6/2002 Tsukamoto
2002/0107658 A1 8/2002 McCall
2002/0185611 A1 12/2002 Menapace et al.
2003/0003608 A1 1/2003 Arikado et al.
2003/0010123 A1 1/2003 Malvern et al. ........ 73/514.32
2003/0029238 A1 2/2003 Challoner ........ 73/504.02
2003/0196490 A1 10/2003 Cardarelli
2003/0205948 A1 11/2003 Lin et al.
2004/0055380 A1 3/2004 Shcheglov et al. ........ 73/504.13
2004/0065864 A1 4/2004 Vogt et al.
2004/0189311 A1 9/2004 Glezer ........ 436/104
2004/0211052 A1 10/2004 Kubena et al. ........ 29/594
2005/0034822 A1 2/2005 Kim et al.
2005/0062368 A1 3/2005 Hirasawa
2005/0093659 A1 5/2005 Larson et al.
2005/0156309 A1 7/2005 Fuji ........ 257/702
2005/0260792 A1 11/2005 Patel ........ 438/107
2006/0016065 A1 1/2006 Nagaura
2006/0055479 A1 3/2006 Okazaki et al.
2006/0066419 A1 3/2006 Iwaki
2006/0197619 A1 9/2006 Oishi et al.
2006/0213266 A1 9/2006 French
2006/0252906 A1 11/2006 Godschalx et al. ........ 528/86
2007/0017287 A1 1/2007 Kubena ........ 73/504.02
2007/0205839 A1 9/2007 Kubena et al. ........ 331/158
2007/0220971 A1 9/2007 Ayazi
2007/0240508 A1 10/2007 Watson
2008/0034575 A1 2/2008 Chang et al. ........ 29/594
2008/0074661 A1 3/2008 Zhang

(56) References Cited

U.S. PATENT DOCUMENTS

| | | | | |
|---|---|---|---|---|
| 2008/0096313 | A1 | 4/2008 | Patel | 438/107 |
| 2008/0148846 | A1 | 6/2008 | Whelan | |
| 2009/0189294 | A1 | 7/2009 | Chang | |
| 2010/0020311 | A1 | 1/2010 | Kirby | |
| 2010/0148803 | A1* | 6/2010 | Ohnishi et al. | 324/662 |
| 2011/0107838 | A1* | 5/2011 | Suijlen et al. | 73/702 |
| 2012/0000288 | A1* | 1/2012 | Matsuura et al. | 73/579 |
| 2012/0266682 | A1* | 10/2012 | Torashima et al. | 73/715 |

FOREIGN PATENT DOCUMENTS

| | | | |
|---|---|---|---|
| EP | 0 461 761 | | 12/1991 |
| EP | 0 531 985 | A1 | 3/1993 |
| EP | 1055908 | | 11/2000 |
| EP | 0 971 208 | | 12/2000 |
| JP | 57-091017 | | 6/1982 |
| JP | 401129517 | | 5/1989 |
| JP | 04322507 | A | 11/1992 |
| JP | 5286142 | | 11/1993 |
| JP | 6-318533 | | 11/1994 |
| JP | 08330878 | A | 12/1996 |
| JP | 9-247025 | | 9/1997 |
| JP | 2003-318685 | | 11/2003 |
| JP | 2005-180921 | A | 7/2005 |
| JP | 2006-352487 | | 12/2006 |
| KR | 10-2001-0110428 | A | 12/2001 |
| WO | 84-00082 | | 1/1984 |
| WO | 96/38710 | | 12/1996 |
| WO | 98/15799 | | 4/1998 |
| WO | 00/68640 | | 11/2000 |
| WO | 01/44823 | | 6/2001 |
| WO | 01/74708 | | 10/2001 |
| WO | 02/12873 | | 2/2002 |
| WO | 2005/121769 | | 12/2005 |
| WO | 2006/010206 | | 2/2006 |
| WO | 2006/103439 | | 10/2006 |

OTHER PUBLICATIONS

U.S. Appl. No. 10/043,378, filed Jan. 25, 2005, Kubena.
U.S. Appl. No. 10/458,911, filed Jul. 20, 2006, Kubena.
U.S. Appl. No. 11/502,336, filed Aug. 9, 2006, Chang.
U.S. Appl. No. 11/800,289, filed May 4, 2007, Kubena.
U.S. Appl. No. 11/800,294, filed May 4, 2007, Kubena.
U.S. Appl. No. 11/818,797, filed Jun. 14, 2007, Kirby.
U.S. Appl. No. 11/881,461, filed Jul. 27, 2007, Kubena.
U.S. Appl. No. 12/026,486, filed Feb. 5, 2009, Kubena.
U.S. Appl. No. 12/027,247, filed Feb. 6, 2008, Kubena.
U.S. Appl. No. 12/034,852, filed Feb. 21, 2008, Chang.
U.S. Appl. No. 12/145,678, filed Jun. 25, 2008, Kirby.
U.S. Appl. No. 12/179,579, filed Jul. 24, 2008, Kubena.
U.S. Appl. No. 12/268,309, filed Nov. 10, 2008, Kubena.
U.S. Appl. No. 12/399,680, filed Mar. 6, 2009, Chang.
U.S. Appl. No. 12/488,784, filed Jun. 22, 2009, Kubena.
U.S. Appl. No. 12/820,761, filed Jun. 22, 2010, Chang.
U.S. Appl. No. 12/831,028, filed Jul. 6, 2010, Chang.
U.S. Appl. No. 13/163,357, filed Jun. 7, 2011, Kubena.
U.S. Appl. No. 13/410,998, filed Mar. 2, 2012, Kubena.
U.S. Appl. No. 13/434,144, filed Mar. 29, 2012, Kubena.
Aaltonen, T., et al., "ALD of Rhodium thin films from Rh(acae), and Oxygen," Electrochemical and Solid-State Lett. 8, C99-C101 (2005).
Burdess et al., "The Theory of a Piezoelectric Disc Gyroscope", Jul. 1986, IEEE vol. AES 22, No. 4; p. 410-418.
Lin, J.W. et al., "A Robust High-Q Micromachined RF Inductor for RFIC Applications," IEEE Transactions on Electronic Devices, vol. 52, No. 7, pp. 1489-1496 (Jul. 2005).
Park, K.J., et al., "Selective area atomic layer deposition of rhodium and effective work function characterization in capacitor structures," Applied Physics Letters 89, 043111 (2006).
U.S. Appl. No. 12/575,634, filed Oct. 8, 2009, Kubena.
Evoy, S., et al., "Temperature-dependent internal friction in silicon nanoelectromechanical systems," Applied Physics Letters, vol. 77, No. 15, pp. 2397-2399 (Oct. 9, 2000).
Wright et al., "The HRG Applied to a Satellite Attitude Reference System," Guidance and Control, AASAAS, 1994, 86:55-67.
Putty et al., "A Micromachined Vibrating Ring Gyroscope,", Solid State Sensor and Actuator Workshop, Transducer Research Foundation, Hilton Head, 1994, pp. 213-220.
Tang et al., "A Packaged Silicon MEMS Vibratory Gyroscope for Microspacecraft," Proceedings IEEE, 10th Annual Int. Workshop on MEMS, Japan, 1997, pp. 500-505.
Barbour et al., "Micromechanical Silicon Instrument and Systems Development at Draper Laboratory," AIAA Guidance Navigation and Control Conference, 1996, Paper No. 96-3709.
Johnson et al., "Surface Micromachined Angular Rate Sensor," A1995 SAE Conference, Paper No. 950538, pp. 77-83.
Fujita et al., "Disk-shaped bulk micromachined gyroscope with vacuum sealing," Sensors and Actuators A:Physical, vol. 82, May 2000, pp. 198-204.
Skulski et al., "Planar resonator sensor for moisture measurements", Microwaves and Radar, 1998, MIKON '98, 12th International Conf., vol. 3, May 20-22, 1998, pp. 692-695.
Tang et al., "Silicon Bulk Micromachined Vibratory Gyroscope," Jet Propulsion Lab.
Sirbuly, Donald J. et al., Multifunctional Nanowire Evanescent Wave Optical Sensors, Advanced Materials, 2007 (published online Dec. 5, 2006), 19, pp. 61-66.
White, Lan M., et al., Increasing the Enhancement of SERS with Dielectric Microsphere Resonators, Spectroscopy-Eugene, Apr. 2006.
Yan, Fei, et al., "Surface-enhanced Raman scattering (SERS) detection for chemical and biological agents," IEEE Sensors Journal, vol. 5, No. 4, Aug. 2005.
Abe, Takashi, et al., "One-chip multichannel quartz crystal microbalance (QCM) fabricated by Deep RIE," *Sensors and Actuators*, vol. 82, pp. 139-143, 2000.
Cleland, A.N., et al., "Fabrication of high frequency nanometer scale mechanical resonators from bulk Si crystals," *Appl. Phys. Lett.*, vol. 69, No. 18, pp. 2653-2655, Oct. 28, 1996.
Greer, J.A., et al., "Properties of SAW resonators fabricated on quartz substractes of various qualities," Ultrasonics Symposium, Proceedings, 1994 IEEE, vol. 1, 1-4, pp. 31-36, Nov. 1994.

* cited by examiner

RESONATOR WITH A FLUID CAVITY THEREIN

CROSS REFERENCE TO RELATED APPLICATIONS

This application is a divisional of U.S. application Ser. No. 12/575,634 entitled "High Frequency Quartz-based Resonators and Methods of Making Same" filed on Oct. 8, 2009, the contents of which are hereby incorporated by reference.

Published PCT Application WO 2006/103439 entitled "Cartridge for a Fluid Sample Analyzer" and U.S. Pat. No. 7,237,315, entitled "Method for Fabricating a Resonator" are hereby incorporated herein by this reference.

TECHNICAL FIELD

This application relates to high frequency quartz-based resonators, which may be used in biological analysis applications at high frequencies such as VHF and/or UHF frequencies, and methods of making same.

BACKGROUND

Small biological detectors using quartz mass sensing currently are commercially implemented using low frequency (~10 MHz) quartz resonators on macro-size substrates mounted on plastic disposable cartridges for biological sample exposure and electrical activation.

Previous quartz resonators used in biological analysis have utilized flat quartz substrates with electrodes deposited on opposite sides of the quartz for shear mode operation in liquids. In order for the substrates not to break during fabrication and assembly, the quartz substrate needs to be of the order of 100 microns thick. This sets a frequency limit for the resonator of roughly ~20 MHz since the frequency is inversely proportional to the thickness.

Chemically etching inverted mesas has been used to produce higher frequency resonators, but this usually produces etch pits in the quartz that can result in a porous resonator which is not suitable for liquid isolation.

However, it is well known that the relative frequency shift for quartz sensors for a given increase in the mass per unit area is proportional to the resonant frequency as given by the Sauerbrey equation. Therefore, it is desirable to operate the sensor at a high frequency (UHF) and thus use ultra-thin substrates that have not been chemically etched.

It is also desirable to minimize the diffusion path length in the analyte solution to the sensor surface to minimize the reaction time needed to acquire a given increase in the mass per unit area. Thus, the dimension of the flow cell around the sensor in the direction perpendicular to the sensor should be minimized. Currently, this dimension is determined by the physical thickness of adhesive tape (WO 2006/103439 A2) and is of the order of 85 microns. It is desirable not to increase this dimension when implementing a higher frequency resonator. In addition, the alignment of tape and the quartz resonators can be difficult and unreliable thereby causing operational variations.

Current UHF quartz MEMS resonators fabricated for integration with electronics (see U.S. Pat. No. 7,237,315) can not be used in commercial low cost sensor cartridges since one metal electrode can not be isolated in a liquid from the other electrode and electrical connections can not be made outside the liquid environment.

Commercial quartz resonators are formed by lapping and polishing small 1-2 inch quartz substrates to approximately the proper frequency and then chemically etching away the unwanted quartz between the resonators. Chemical etching is also used to fine tune the frequencies and to etch inverted mesas for higher frequency operation. However, as stated above, handling and cracking issues usually dictate that the lapped and polished thicknesses are of the order of 100 microns, and chemically etching deep inverted mesas produces etch pits which significantly reduce the yield and can result in a porous resonator. This invention suggests utilizing the previously disclosed (see U.S. Pat. No. 7,237,315 mentioned above) handle wafer technology for handling large thin quartz substrates for high frequency operation plus double inverted mesa technology using dry etching for providing high frequency non-porous resonators with (1) a thick frame for minimizing mounting stress changes in the resonator frequencies once a flow cell is formed, (2) a thin flow cell for reducing the sensor reaction time, and (3) quartz through wafer vias for isolating the active electrodes and electrical interconnects from the flow cell. Since, to the inventor's understanding, commercial manufacturers do not use quartz plasma etching for defining thin non-porous membranes nor quartz through-wafer vias for conventional packaging, the current fabrication and structure would not be obvious to one skilled in the art familiar with this conventional technology.

There is a need for even smaller biological detectors, which can effectively work with even smaller sample volumes yet having even greater sensitivity than prior art detectors.

BRIEF DESCRIPTION OF THE INVENTION

The present invention provides a quart resonator including a piezoelectric quartz wafer having an electrode, pads, and interconnects disposed on a first side thereof, having a second electrode disposed on a second side thereof, the second electrode being disposed opposing the first mentioned electrode, and having at least one penetration for coupling the electrode on said second side of said piezoelectric quartz wafer to one of the pads on said first side of said piezoelectric quartz wafer; and a substrate with fluid ports provided therein, the piezoelectric quartz wafer being mounted to the substrate such the second side thereof faces the substrate with a cavity being defined between the substrate and the wafer and such that the fluid ports in the substrate are aligned with the electrode on the second side of the piezoelectric quartz wafer, thereby forming a flow cell in the cavity with the electrode disposed on the second side of the piezoelectric quartz wafer being in contact with said flow cell and the electrode formed on the first side of the piezoelectric quartz wafer being disposed on said wafer opposite said flow cell.

DETAILED DESCRIPTION

Figures 1A, 1B, 1C, 1D, 1E:
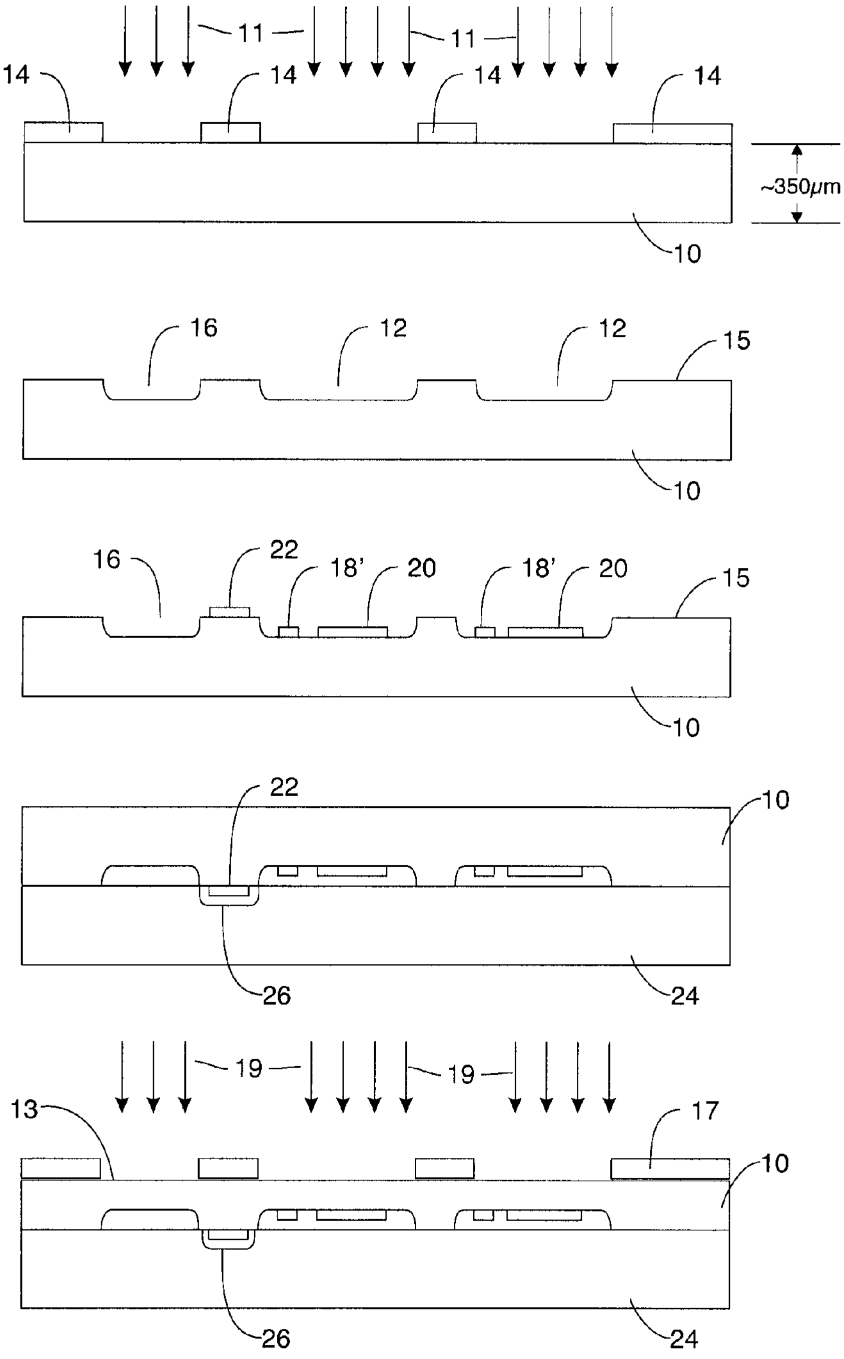
FIGS. 1(*a*)-1(*l*) depict, in a series of side elevational views, steps which may be used to make the sensor described herein and also serve to show its internal construction details.
Figure 1F:
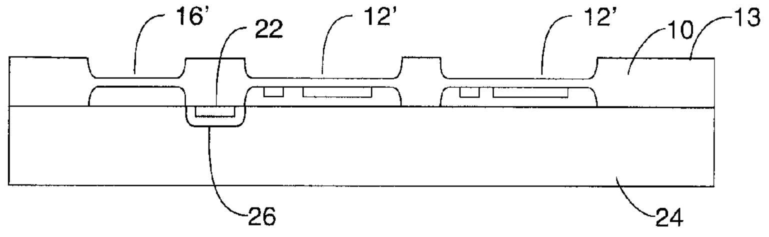
Figure 1G:
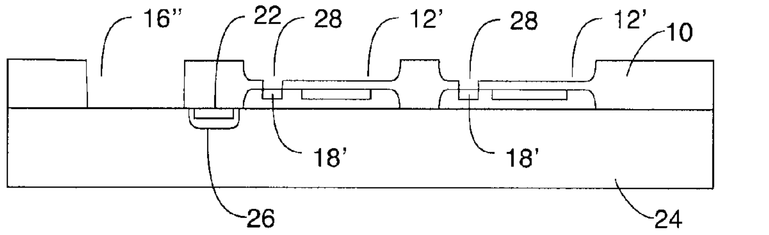
Figure 1H:
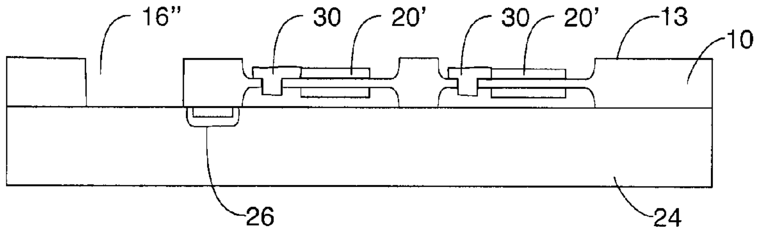
Figure 1I:
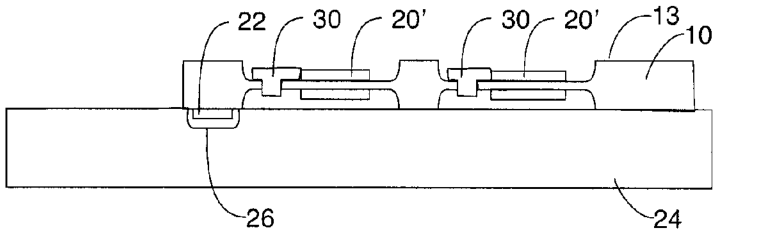
Figure 1J:
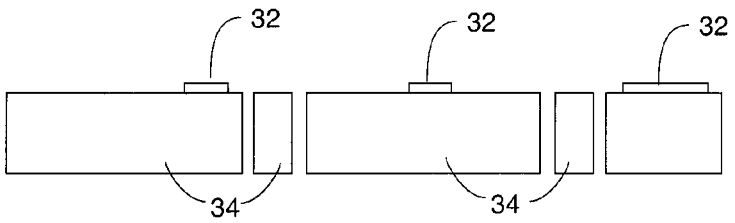
Figure 1K:
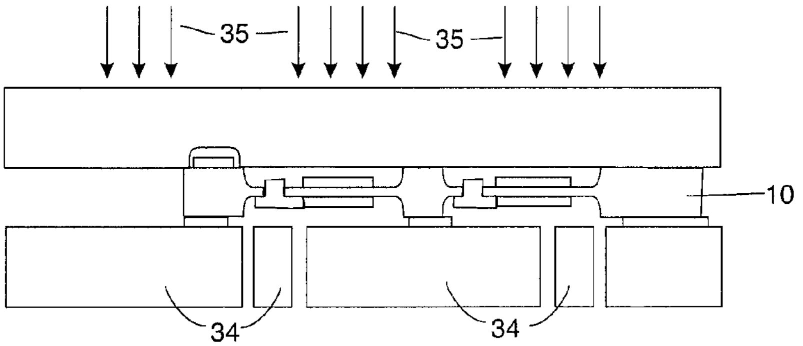
Figure 1L:
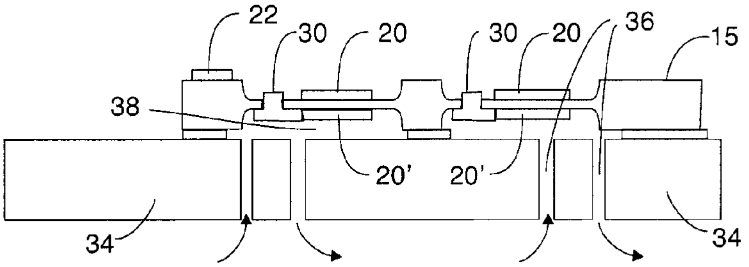

FIGS. 1(*a*)-1(*l*) depict, in a series of side elevational views, steps which may be used to make the sensor described herein. These elevation views are taken along a section line 1-1 depicted in FIG. 2.

The formation of the disclosed sensor starts with a piezoelectric quartz wafer 10 preferably 3"~4" in diameter, AT-cut, with a thickness of preferably about 350 microns. As shown in FIG. 1(*a*), a mask 14 in combination with a dry plasma etch 11

(to prevent the formation of etch pits), are preferably used to form inverted mesas 12 (see FIG. 1(*b*)) etched in a top or first surface of wafer 10. Mask 14 is preferably formed of a thick resist or metal such as Ni or Al. In this connection, a solid layer of Ni or Al is may be put down and then a conventional photo-mask may be used to etch the Ni or Al in order to make mask 14 out of that metal. The preferred approach is to electroplate Ni onto a resist mold to form mask 14. This dry plasma etch 11 through mask 14 is optional, but is preferred, and it preferably etches about 10 to 20 microns deep into the piezoelectric quartz wafer 10 through the openings in mask 14 thereby forming inverted mesas 12 and preferably one or more additional regions 16. Regions 16 are also preferably etched at the same time for eventually cleaving or separating the quartz 10 into a plurality of sensors made on a common quartz wafer 10 along dicing lanes.

Next, the mask 14 is stripped away and interconnect metal 18, preferably comprising Cr/Ni/Au, is formed for use in help forming vias (which will be more fully formed later wherein a portion of the interconnect metal acts an as etch stop 18'). Additionally, top side (or first side) electrodes 20 are formed at the same time preferably comprising Cr/Ni/Au. Metal pads $22_1$-$22_3$ are also formed, preferably of Cr/Au, for cartridge pins. The interconnect metal 18 (including etch stops 18'), electrodes 20 and pads $22_1$-$22_3$ are formed as shown in FIGS. 1(*c*) and 2. A spray resist may be utilized to define the pattern of the metalization for interconnect metal 18 and top side electrodes 20 in the inverted mesas 12 and the metalization for pads 22 on unetched surfaces of quartz wafer 10. The pads $22_1$-$22_3$ are collectively numbered 22 in FIG. 1(*d*).

The interconnect metal 18 preferably interconnects pad $22_3$ and the top side electrode 20 and preferably interconnects pads $22_1$ and $22_2$ and with metal plugs 30 to be formed in the yet to be formed vias 28. See FIG. 2.

Turning now to FIG. 1(*d*), the top or first side 15 of the quartz wafer 10 is then bonded, preferably at a low temperature (for example, less than ° C.), to a Si handle wafer 24 shown in FIG. 1(*d*) for further thinning and polishing of the quartz wafer 10 using lapping, grinding, and/or chemical mechanical polishing (CMP), for example. Handle wafer 24 preferably has one or more inverted mesas 26 for receiving the topside pads $22_1$-$22_3$ disposed on the unetched top or first surface 15 of wafer 10. The quartz wafer 10 is then preferably thinned to about 2-50 microns depending on final design requirements. The quartz wafer 10 typically starts out being thicker, since it is commercially available in thicknesses greater than needed, and therefor quartz wafer 10 typically should be thinned to a desired thickness, preferably in the range of 10 to 50 microns.

Next the inverted quartz wafer 10 is plasma etched again, preferably using the same Ni or Al metal mask and photoresist masking technique as described above, with a mask 17 and a dry etch 19 (see FIG. 1(*e*)) to form inverted mesas 12' and dicing lanes 16' in the bottom side or second surface 13 of the quartz wafer 10, the inverted mesas 12' and dicing lanes 16' being preferably aligned with the top side inverted mesas 12 and dicing lanes 16 respectively, as shown in FIG. 1(*f*). In combination with bonding adhesive or tape 32 (see FIG. 1(*j*)) thickness used on a cartridge 34, the bottom etch depth defines a vertical dimension of a yet-to-be-formed flow cell 38 (see FIG. 1(*l*)).

Turning now to FIG. 1(*g*), vias 28 are then etched against etch stops 18', preferably using a dry etch, in the depicted structure and dicing lanes 16" are preferably etched through by joining the previously etched regions 16 and 16'. The etching of vias 28 stop against the Ni layer in etch stop layer 18' in the top-side interconnect metalization 18 as shown in FIG. 1(*g*). As previously mentioned, the etch stop layer 18' is preferably Cr/Ni/Au, so the Cr layer thereof is etched through and the dry etching stops at the Ni layer thereof. This etch stop layer 18' is preferably formed by the interconnect metal 18. The vias 28 are then coated with preferably a metal using a thick resist process to electrically connect to interconnect 18 exposed in the vias 28 to form plugs 30. A coated metal, such as a sputter layer, for example, is used to cover the exposed interconnect in the via opening 28 with a conformal metal layer 30 such as a sputtered Au layer for connecting the bottom electrodes 20' to top-side interconnects 18 and to pin pad $22_3$. Finally, bottom electrode metal 20' is deposited as shown in FIG. 1(*h*). The final resonator quartz thickness is preferably about 2-10 microns measured between the metal electrodes 20, 20' while the quartz frame surrounding the inverted mesas 12, 12' is perhaps 30-50 microns in thickness. However, a simplified process is envisioned in which one of both inverted mesa etches are omitted (so inverted mesas 12, 12' are formed on only one side of the quartz wafer 10 or on neither side thereof), in which case the quartz wafer 10 is left planar or quasi-planar with a thinned thickness of about 10 microns.

The completed wafer 10 is then diced along dicing lines 16" to yield individual dies of two or more resonators mounted on a Si handle wafer 24 as shown in FIG. 1(*i*). The final assembly to a plastic cartridge 34 (a bottom portion of which is depicted in FIG. 1(*j*)) is accomplished (see FIG. 1(*k*)) using die bonding to an adhesive 32 located on the cartridge 34. This adhesive 32 can be, for example, in the form of a kapton polyimide tape with a silicone (for example) adhesive layer or a seal ring of epoxy applied with an appropriate dispensing system. Other adhesives may be used if desired or preferred. Once bonded to the cartridge 34, the resonators are released preferably using a dry etch 35 such as $SF_6$ plasma etching and/or $XeF_2$ to remove the Si handle wafer 24 as shown in FIGS. 1(*k*) and 1(*l*). Of course, this etching step should not significantly etch the adhesive 32. A top section of the cartridge 34, such as the cartridge described in published PCT Application WO 2006/103439 A2, can then be aligned and adhered to the bottom portion for use as shown by FIG. 1(*l*). Openings 36 in the cartridge 34 allow a fluid (depicted by the arrows) to enter and exit a chamber 38 defined by the walls of the inverted mesas. Alternatively, the dicing may be accomplished after attachment of the cartridge whereby the cartridges could be formed as an array mounted on a thin plastic sheet and brought into contact with a plurality of dies all at the same time.

Figure 2:
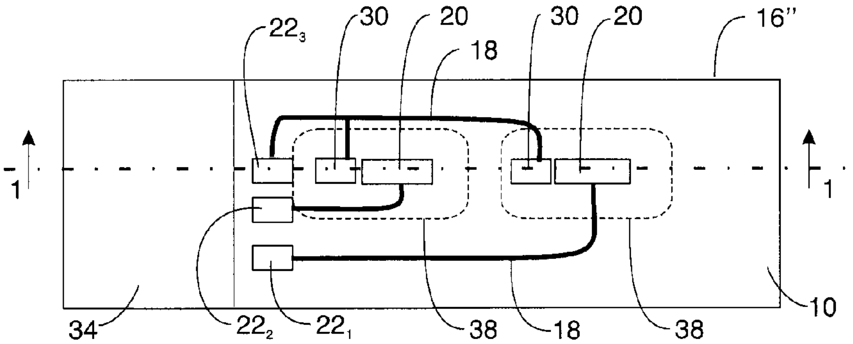
FIG. 2 is a top view of the sensor described herein.

The resonators are electrically excited by signals applied on the top pads as shown in the top-view drawing in FIG. 2. An analyte flows through the resonator along the flow paths shown by the arrows in FIG. 1(*l*) into and out of chambers 38 defined in the resonators. The pad $22_3$ is preferably connected to a ground associated with the resonator detector signal. Pads $22_1$ and $22_2$ are connected to the electrodes 20 on the first side of the piezoelectric wafer 10. In this way the electrode 20' on the second side of the piezoelectric quartz wafer is grounded and the analyte in chamber 38 is exposed to the grounded electrode 20' on the second side of the piezoelectric quartz wafer 10, thereby preventing electrical coupling of detector signals obtained at pads $22_1$ and $22_2$ from the electrodes 20 on the first side of the piezoelectric quartz wafer 10 to the analyte in chamber 38.

The dimensions of the chambers 38 are preferably on the order of 400×400 μm square and 40 μm deep, yielding a sample volume of approximately $6.4\times10^{-6}$ cc (6.4 mL).

In broad overview, this description has disclosed a method for fabricating VHF and/or UHF quartz resonators (for higher sensitivity) in a cartridges design with the quartz resonators requiring much smaller sample volumes than required by conventional resonators, and also enjoying smaller size and more reliable assembly. MEMS fabrication approaches are used to fabricate with quartz resonators in quartz cavities with electrical interconnects on a top side of a substrate for electrical connection to the electronics preferably through pressure pins in a plastic module. An analyte is exposed to grounded electrodes on a single side of the quartz resonators, thereby preventing electrical coupling of the detector signals through the analyte. The resonators can be mounted on the plastic cartridge or on arrays of plastic cartridges with the use of inert bonding material, die bonding or wafer bonding techniques. This allows the overall size, cost, and required biological sample volume to be reduced while increasing the sensitivity for detecting small mass changes.

At least the following concepts have been presented by the present description.

Concept 1. A method of fabricating quartz resonators comprising:

forming electrodes, pads, and interconnects on a first side of a piezoelectric quartz wafer;

bonding the quartz substrate to one or more handle wafers;

etching vias in the piezoelectric quartz wafer;

forming electrodes and interconnects on a second side of the piezoelectric quartz wafer;

forming metal plugs in said vias to connect the electrodes on said second side of said piezoelectric quartz wafer to the pads on said first side of said piezoelectric quartz wafer;

dicing the piezoelectric quartz wafer along dicing lines formed therein to thereby define a plurality of dies, each die having at least one metal electrode formed on the first side of the piezoelectric quartz wafer thereof and at least one opposing metal electrode formed on the second side of the piezoelectric quartz wafer thereof;

adhering the dies to a substrate with fluid ports therein, the fluid ports being associated with the electrodes of the die, thereby forming at least one flow cell in each die with the at least one electrode formed on the first side of the piezoelectric quartz wafer in said at least one flow cell and at least one opposing electrode formed on the second side of the piezoelectric quartz wafer of said at least one die opposite said at least one flow cell; and removing the one or more handle wafers, thereby exposing the pads on the first side of the dies, said pads, in use, providing circuit connection points for allowing electrical excitation of the electrodes.

Concept 2. The method of fabricating quartz resonators according to concept 1 further comprising etching inverted mesas in the first side of the piezoelectric quartz wafer wherein the electrodes formed on said first side are disposed within one or more of said inverted mesas.

Concept 3. The method of fabricating quartz resonators according to concept 2 further comprising etching inverted mesas in the second side of the piezoelectric quartz wafer wherein the electrodes formed on said second side of the piezoelectric quartz wafer are disposed within one or more of said inverted mesas formed on said second side of the piezoelectric quartz wafer.

Concept 4. The method of fabricating quartz resonators according to concept 3 in which the inverted mesas are etched with a plasma etch.

Concept 5. The method of fabricating quartz resonators according to concept 1 further comprising etching inverted mesas in the second side of the piezoelectric quartz wafer wherein the electrodes formed on said second side of the piezoelectric quartz wafer are disposed within one or more of said inverted mesas formed on said second side of the piezoelectric quartz wafer.

Concept 6. The method of fabricating quartz resonators according to concept 5 in which the inverted mesas are etched with a plasma etch.

Concept 7. The method of fabricating quartz resonators according to concept 1 further comprising thinning the piezoelectric quartz wafer to 2-50 microns in an active resonator region between the electrodes formed on said first and second sides of the piezoelectric quartz wafer.

Concept 8. The method of fabricating quartz resonators according to concept 1 wherein the dies are adhered to said substrate with fluid ports therein using an inert polyimide-based tape or an epoxy adhesive.

Concept 9. The method of fabricating quartz resonators according to concept 1 wherein the one or more handle wafers is removed with a fluorine-based plasma etch and/or $XeF_2$.

Concept 10. A method of analyzing an analyte using a quartz resonator made in accordance with concept 1 wherein the electrode on the second side of the piezoelectric quartz wafer is grounded and the analyte is exposed to the grounded electrode on the second side of the piezoelectric quartz wafer, thereby preventing electrical coupling of detector signals, obtained from the electrode on the first side of the piezoelectric quartz wafer, to the analyte.

Concept 11. A method of fabricating a quartz resonator comprising:

forming electrode, pads, and interconnects on a first side of a piezoelectric quartz wafer;

bonding the quartz substrate to a handle wafer;

forming at least one via in the piezoelectric quartz wafer;

forming an electrode on a second side of the piezoelectric quartz wafer, the electrode on the second side of the piezoelectric quartz wafer directly opposing the electrode on the first side of the piezoelectric quartz wafer;

forming at least one metal plug in said at least one via and connecting the electrode on said second side of said piezoelectric quartz wafer to one of the pads on said first side of said piezoelectric quartz wafer;

adhering said piezoelectric quartz wafer to a substrate with fluid ports therein, the fluid ports being aligned to the electrode on the second side of the piezoelectric quartz wafer, thereby forming a flow cell in the quartz resonator with the electrode formed on the second side of the piezoelectric quartz wafer being disposed in said flow cell and the electrode formed on the first side of the piezoelectric quartz wafer being disposed opposite said flow cell; and removing the handle wafer, thereby exposing the pads on the first side of the piezoelectric quartz wafer, said pads, in use, providing circuit connection points for allowing electrical excitation of the electrodes.

Concept 12. The method of fabricating a quartz resonator according to concept 11 further comprising etching one or more inverted mesas in the first side of the piezoelectric quartz wafer wherein the metal electrode formed on said first side is disposed within one of said one or more inverted mesas.

Concept 13. The method of fabricating a quartz resonator according to concept 12 further comprising etching one or more inverted mesas in the second side of the piezoelectric quartz wafer wherein the metal electrode formed on said second side of the piezoelectric quartz wafer is disposed within one of said one or more inverted mesas formed on said second side of the piezoelectric quartz wafer.

Concept 14. The method of fabricating a quartz resonator according to concept 13 wherein a plurality of electrodes are formed in a plurality of inverted mesas formed in the first side of the piezoelectric quartz wafer and a plurality of electrodes are formed in a plurality of inverted mesas formed in the second side of the piezoelectric quartz wafer, the inverted mesas in the first side of the piezoelectric quartz wafer opposing corresponding inverted mesas in the second side of the piezoelectric quartz wafer and the electrodes formed in inverted mesas in the first side of the piezoelectric quartz wafer opposing corresponding electrodes formed in inverted mesas in the second side of the piezoelectric quartz wafer.

Concept 15. The method of fabricating a quartz resonator according to concept 11 further comprising etching one or more inverted mesas in the second side of the piezoelectric quartz wafer wherein the metal electrode formed on said second side of the piezoelectric quartz wafer is disposed within one of said one or more inverted mesas formed on said second side of the piezoelectric quartz wafer.

Concept 16. The method of fabricating a quartz resonator according to concept 15 in which the inverted mesas are etched with a plasma etch.

Concept 17. The method of fabricating quartz resonators according to concept 11 further comprising thinning the piezoelectric quartz wafer to 2-50 microns in an active resonator region between opposing electrodes formed on said first and second sides of the piezoelectric quartz wafer.

Concept 18. The method of fabricating quartz resonators according to concept 11 wherein the piezoelectric quartz wafer is adhered to said substrate with fluid ports therein using an inert polyimide-based tape or an epoxy adhesive.

Concept 19. The method of fabricating quartz resonators according to concept 11 wherein the one or more handle wafers is removed with a fluorine-based plasma etch and/or $XeF_2$.

Concept 20. A method of analyzing an analyte using a quartz resonator made in according with concept 11 wherein the electrode on the second side of the piezoelectric quartz wafer is grounded and the analyte is exposed to the grounded electrodes on the second side of the piezoelectric quartz wafer, thereby preventing electrical coupling of detector signals, obtained from the electrode on the first side of the piezoelectric quartz wafer, to the analyte.

Concept 21. A quart resonator for comprising:

a piezoelectric quartz wafer with an electrode, pads, and interconnects disposed on a first side thereof, piezoelectric quartz wafer having a second electrode disposed on a second side thereof, the second electrode opposing the first mentioned electrode, the electrode on said second side of said piezoelectric quartz wafer being connected to one of the pads on said first side of said piezoelectric quartz wafer; and a substrate having fluid ports therein, the piezoelectric quartz wafer being mounted to the substrate such the second side thereof faces the substrate with a cavity being defined between the substrate and the wafer and such that the fluid ports in the substrate are aligned with the electrode on the second side of the piezoelectric quartz wafer, thereby forming a flow cell in the cavity with the electrode disposed on the second side of the piezoelectric quartz wafer being in contact with said flow cell and the electrode formed on the first side of the piezoelectric quartz wafer being disposed on the first side of said wafer and opposite to said flow cell.

Concept 22. The quart resonator of concept 21 wherein the wafer has at least one inverted mesa defined therein for forming at least a portion of said cavity.

Concept 23. The quart resonator of concept 21 wherein the wafer as a penetration for connecting the electrode on said second side of said piezoelectric quartz wafer to one of the pads on said first side thereof.

Concept 24. The quart resonator of concept 21 wherein an analyte is in said cavity and wherein the electrode on the second side of the piezoelectric quartz wafer is grounded and detector signals are coupled to the electrode on the first side of the wafer so that the analyte is exposed to the grounded electrode on the second side of the piezoelectric quartz wafer, thereby preventing electrical coupling of detector signals, from the electrode on the first side of the piezoelectric quartz wafer, to the analyte.

Having described the invention in connection with certain embodiments thereof, modification will now suggest itself to those skilled in the art. As such, the invention is not to be limited to the disclosed embodiment except as is specifically required by the appended claims.

The invention claimed is:

1. A quartz resonator comprising:

a piezoelectric quartz wafer with an electrode, pads, and interconnects disposed on a first side thereof, the piezoelectric quartz wafer having a second electrode disposed on a second side thereof, the second electrode opposing the first mentioned electrode, the electrode on said second side of said piezoelectric quartz wafer being connected to one of the pads on said first side of said piezoelectric quartz wafer; and a substrate having fluid ports therein, the piezoelectric quartz wafer being mounted to the substrate such that the second side thereof faces the substrate with a cavity being defined between the substrate and the wafer and such that the fluid ports in the substrate are aligned with the electrode on the second side of the piezoelectric quartz wafer, thereby forming a flow cell in the cavity with the electrode disposed on the second side of the piezoelectric quartz wafer being in contact with said flow cell and the electrode formed on the first side of the piezoelectric quartz wafer being disposed on the first side of said wafer and opposite to said flow cell.

2. The quart resonator of claim 1 wherein the wafer has at least one inverted mesa defined therein for forming at least a portion of said cavity.

3. The quart resonator of claim 1 wherein the wafer has a penetration for connecting the electrode on said second side of said piezoelectric quartz wafer to one of the pads on said first side thereof.

4. The quart resonator of claim 1 wherein an analyte is in said cavity and wherein the electrode on the second side of the piezoelectric quartz wafer is grounded and detector signals are coupled to the electrode on the first side of the wafer so that the analyte is exposed to the grounded electrode on the second side of the piezoelectric quartz wafer, thereby preventing electrical coupling of detector signals, from the electrode on the first side of the piezoelectric quartz wafer, to the analyte.

* * * * *